(12) United States Patent
Wu et al.

(10) Patent No.: US 11,088,540 B2
(45) Date of Patent: Aug. 10, 2021

(54) SWITCH CIRCUIT WITH HIGH VOLTAGE PROTECTION THAT REDUCES LEAKAGE CURRENTS

(71) Applicant: SEMICONDUCTOR COMPONENTS INDUSTRIES, LLC, Phoenix, AZ (US)

(72) Inventors: Hong Bing Wu, Beijing (CN); Young Liang Li, Beijing (CN); WeiMing Sun, Beijing (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 364 days.

(21) Appl. No.: 16/174,507

(22) Filed: Oct. 30, 2018

(65) Prior Publication Data

US 2020/0136381 A1 Apr. 30, 2020

(51) Int. Cl.
| | | |
|---|---|---|
| *H02H 9/04* | (2006.01) | |
| *H02H 1/00* | (2006.01) | |
| *G01N 27/04* | (2006.01) | |
| *H03K 17/081* | (2006.01) | |
| *H01R 13/713* | (2006.01) | |

(52) U.S. Cl.
CPC .......... *H02H 9/045* (2013.01); *G01N 27/048* (2013.01); *H02H 1/0007* (2013.01); *H03K 17/08104* (2013.01); *H01R 13/713* (2013.01)

(58) Field of Classification Search
CPC ........ H02H 1/0007; H02H 3/20; H02H 7/222; H02H 9/045; H03K 17/08104; H03K 17/693; G01N 27/048; H01R 13/713
USPC .......................................................... 361/86
See application file for complete search history.

(56) References Cited

U.S. PATENT DOCUMENTS

| | | | |
|---|---|---|---|
| 8,689,033 B2 | 4/2014 | Srivastava et al. | |
| 2010/0073837 A1 | 3/2010 | Predtetchenski et al. | |
| 2015/0008978 A1* | 1/2015 | Kwon .................. | H03K 17/063 327/536 |
| 2015/0377810 A1* | 12/2015 | Roh ...................... | G01N 27/048 324/694 |
| 2016/0173084 A1 | 6/2016 | Huang et al. | |

* cited by examiner

*Primary Examiner* — Kevin J Comber
(74) *Attorney, Agent, or Firm* — Brake Hughes Bellermann LLP

(57) ABSTRACT

According to an aspect, a switch circuit for a Universal Serial Bus (USB) connector device includes a main transistor configured to be activated during a normal operation of the switch circuit, a first voltage generator circuit configured to generate a voltage on a high local rail during an overvoltage event, a second voltage generator circuit configured to generate a voltage on a low local rail during the overvoltage event, where the low local rail is connected to a bulk of the main transistor, and a clamp circuit connected to the high local rail between the first voltage generator circuit and a gate of the main transistor, where the clamp circuit is configured to clamp the voltage between the high local rail and the gate of the main transistor during the overvoltage event.

20 Claims, 9 Drawing Sheets

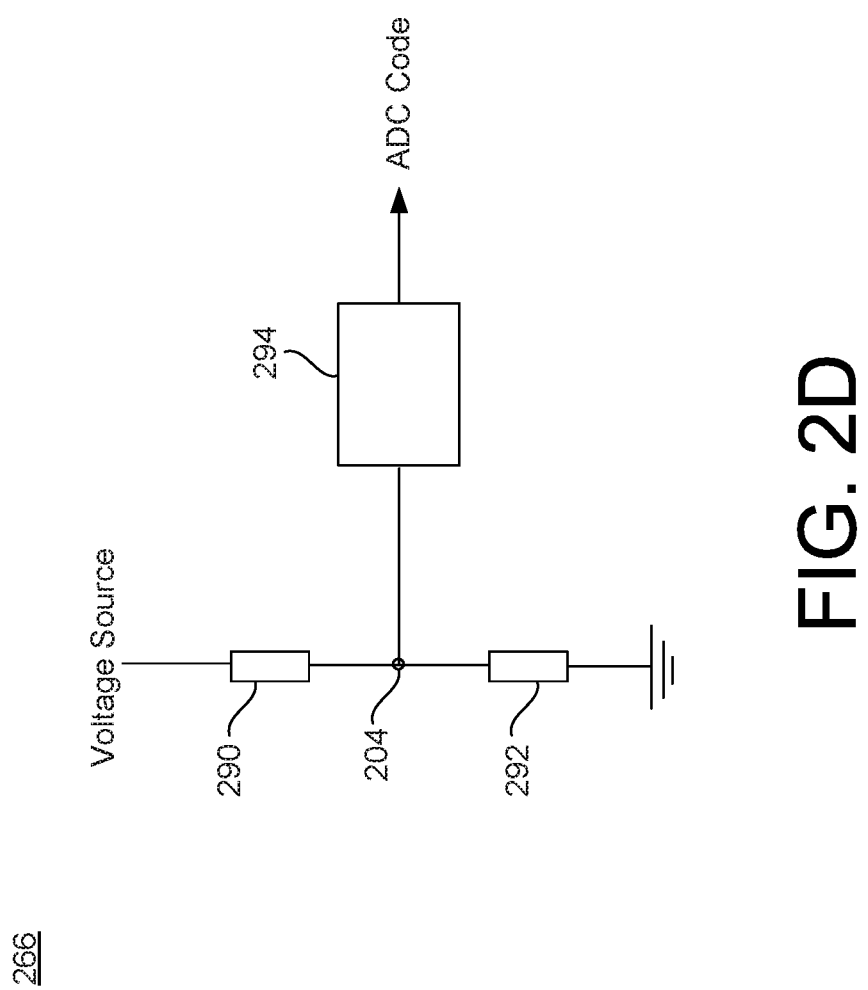

SWITCH CIRCUIT WITH HIGH VOLTAGE PROTECTION THAT REDUCES LEAKAGE CURRENTS

TECHNICAL FIELD

This description relates to a switch circuit for a switch device that provides high voltage protection with reduced leakage currents.

BACKGROUND

Switch circuits may be used in switch devices for computer interface port applications that connect a common node to multiple end nodes. For example, a switch circuit can be used in a switch device for connecting one port to one or more of a plurality of computer interface ports such as Universal Serial Bus (USB) ports, audio ports, etc. In some examples, the switch circuit may include a high voltage protection circuit to protect the switch circuit from high voltage surges.

SUMMARY

According to an aspect, a switch circuit for a Universal Serial Bus (USB) connector device includes a main transistor configured to be activated during a normal operation of the switch circuit, where the main transistor is configured to be deactivated during an overvoltage event, a first voltage generator circuit configured to generate a voltage on a high local rail during the overvoltage event, a second voltage generator circuit configured to generate a voltage on a low local rail during the overvoltage event, where the low local rail is connected to a bulk of the main transistor, and a clamp circuit connected to the high local rail between the first voltage generator circuit and a gate of the main transistor, where the clamp circuit is configured to clamp the voltage between the high local rail and the gate of the main transistor during the overvoltage event.

According to some aspects, the switch circuit may include one or more of the following features (or any combination thereof). The clamp circuit may include a first diode and a second diode. The first voltage generator circuit is configured to provide either a drain voltage of the main transistor or a source voltage of the main transistor as the voltage on the high local rail, whichever is larger. The second voltage generator circuit is configured to provide either a drain voltage of the main transistor or a source voltage of the main transistor as the voltage on the low local rail, whichever is smaller. The switch circuit may include a first bias circuit configured to generate a voltage on the high local rail during the normal operation, and a second bias circuit configured to generate a voltage on the low local rail during the normal operation. The first bias circuit is configured to generate the voltage on the high local rail as one half times a sum of a drain voltage of the main transistor and a source voltage of the main transistor, and the second bias circuit is configured to generate the voltage on the low local rail as one half times a sum of the drain voltage and the source voltage. The switch circuit may include a constant gate-source circuit connected to the main transistor, where the constant gate-source circuit is configured to generate a substantially constant gate-source voltage for the main transistor during the normal operation, and the constant gate-source circuit is connected to the gate of the main transistor and a low rail. The constant gate-source circuit may include a first diode and a transistor. The constant gate-source circuit may include a second diode and a resistor, where the second diode and the resistor are configured to protect the transistor during the overvoltage event. The switch circuit may include an overvoltage protection circuit configured to detect whether a voltage on a common node exceeds a threshold level, where the overvoltage protection circuit is configured to transmit an enable signal in response to the voltage exceeding the threshold level, and a driver circuit configured to deactivate the main transistor in response to the enable signal.

According to an aspect, a switch device includes a first switch circuit, and a second switch circuit connected in-series to the first switch circuit. The first switch circuit and the second switch circuit defines a switch path from a common node to an end node. The first switch circuit and/or the second switch circuit includes a main transistor configured to be activated during a normal operation of the switch device, where the main transistor is configured to be deactivated during an overvoltage event, and a constant gate-source circuit connected to the main transistor, where the constant gate-source circuit is configured to generate a substantially constant gate-source voltage for the main transistor during the normal operation, and the constant gate-source circuit connected to the gate of the main transistor and a low rail.

According to some aspects, the switch device may include any of the above/below features (or any combination thereof). The first or second switch circuit includes a clamp circuit connected to clamp the voltage between the high local rail and the gate of the main transistor during the overvoltage event, where the high local rail is connected to the gate of the main transistor, and the clamp circuit is configured to protect the main transistor from incurring a Safe Operating Range (SOA) warning during the overvoltage event. The clamp circuit may include a diode and a Zener diode. The first or second switch circuit may include a voltage generator circuit configured to generate a voltage on a high local rail during the overvoltage event, where the high local rail is connected to the gate of the main transistor, and the voltage generator circuit is configured to protect the main transistor from incurring a Safe Operating Range (SOA) warning during the overvoltage event. The first or second switch circuit may include a voltage generator circuit configured to generate a voltage on a low local rail during the overvoltage event, where the low local rail is connected to a bulk of the main transistor, and the voltage generator circuit is configured to protect the main transistor from incurring a Safe Operating Range (SOA) warning during the overvoltage event. The constant gate-source circuit may include a first diode, a transistor, a second diode, and a resistor. The switch device may include a moisture detection circuit configured to detect moisture on the common node, and an overvoltage protection circuit configured to detect the overvoltage event by determining that a voltage on the common node exceeds a threshold level. The first or second switch circuit may include a first bias circuit configured to generate a voltage on a high local rail during the normal operation, where the high local rail is connected to the gate of the main transistor, and a second bias circuit configured to generate a voltage on a low local rail during the normal operation, where the low local rail is connected to a bulk of the main transistor.

According to an aspect, a method for reducing leakage current in a switch device includes activating a first transistor of a driver circuit of a switch circuit, charging a gate of a main transistor of the switch circuit using a pull-up current in order to activate the main transistor, and connecting the gate of the main transistor to a low rail such that the pull-up current flows to the low rail. In some examples, the method includes activating a second transistor of the driver circuit and deactivating the first transistor in response to an overvoltage signal, and clamping a voltage on a high local rail, where the high local rail is connected to the gate of the main transistor.

The details of one or more implementations are set forth in the accompanying drawings and the description below. Other features will be apparent from the description and drawings, and from the claims.

BRIEF DESCRIPTION OF THE DRAWINGS

FIG. 2D illustrates a moisture detection circuit according to an aspect.

DETAILED DESCRIPTION

The present disclosure relates to a switch circuit with a high voltage protection circuitry that reduces leakage currents. The switch circuit may include a main switch and one or more protection circuits that protect the main switch in response to an overvoltage event. In some examples, the switch circuit is included within a Universal Serial Bus (USB) device, and the USB device may be protected against high voltage direct current (DC) surges applied on the connector side pin (e.g., DP and/or DM). The reduction of leakage currents may cause the switch circuit to be suitable for moisture detection applications. In some examples, the leakage currents are less than 15 nA (e.g., 10 nA, 5 nA).

In some examples, the switch circuit with high voltage protection circuitry may reduce (or eliminate) Ion leakage current. Ion leakage current may be the current that flows into or out of an end node (e.g., com/DP/DM pin) when the main switch of the switch circuit is activated. In some examples, the switch circuit with high voltage protection circuitry may reduce (or eliminate) Ion off leakage current. Ion off leakage current may be the current that flows into or out of the output node when the main switch is deactivated. When the Ion leakage current and/or the Ion off leakage current are relatively high, the switch device may not be suitable for moisture detection applications because the leakage currents may interfere with the detection of moisture. However, the switch circuit discussed herein may reduce or eliminate the Ion and Ion off leakage currents while protecting against high voltage direct current (DC) surges. In addition, in some examples, the reduction or elimination of the Ion off leakage current may improve the signal's integrity. Also, in some examples, the switch circuit discussed herein may reduce the die size and manufacturing costs.

Figure 1A:
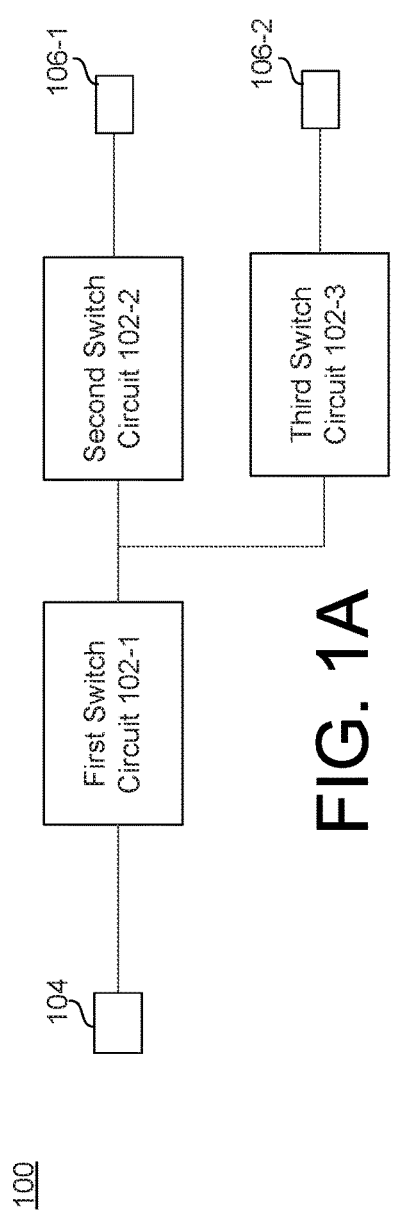
FIG. 1A illustrates a switch device according to an aspect.

FIG. 1A illustrates a switch device 100 according to an aspect. In some examples, the switch device 100 includes a connector-side Universal Serial Bus (USB) switch device. In some examples, the switch device 100 includes a micro-USB switch (MUS) device. The switch device 100 is configured to selectively connect a common node 104 to a first end node 106-1 and/or a second end node 106-2. In some examples, the end nodes may include more than two end nodes. The switch device 100 may define a first switch path from the common node 104 to the first end node 106-1 using a first switch circuit 102-1 and a second switch circuit 102-2. The switch device 100 may define a second switch path from the common node 104 to the second end node 106-2 using the first switch circuit 102-1 and a third switch circuit 102-3.

The first switch circuit 102-1 and the second switch circuit 102-2 may be connected in series with each other. The first switch circuit 102-1 and the third switch circuit 102-3 may be connected in series with each other. Each of switch circuits may be low voltage devices that provide high voltage protection in the case of a DC voltage surge in a manner that reduces (or eliminates) Ion leakage current and Ion off leakage current.

The common node 104 may be a pin, a pad, or a terminal. In some examples, the common node 104 is a communication pin (e.g., com pin) or host pin on the connector side. In some examples, the common node 104 is a negative data terminal or pin (DM) and/or a positive data terminal or pin (DP). The first end node 106-1 and the second end node 106-2 may be output ports. In some examples, the end nodes are computer interface ports that interface with a USB connector on a device. The end nodes may be pins, pads, or terminals. In some examples, the end nodes include one or more audio ports and one or more USB ports. In some examples, the end nodes include an audio port, a first USB port, a second USB port, a first receiver/transmitter port, and/or a second receiver/transmitter port.

The common node 104 is connected to the first end node 106-1 in response to the first switch circuit 102-1 and the second switch circuit 102-2 being activated (or turned-on), which can cause a signal to be transmitted from the common node 104 to the first end node 106-1 (or vice versa). The common node 104 is connected to the second end node 106-2 in response to the first switch circuit 102-1 and the third switch circuit 102-3 being activated, which can cause a signal to be transmitted from the common node 104 to the second end node 106-2 (or vice versa). In response to an overvoltage event being detected on the common node 104 (e.g., the voltage at the common node 104 exceeding a threshold level), the first switch circuit 102-1, the second switch circuit 102-2, and the third switch circuit 102-3 are deactivated (or turned-off).

Ion leakage current may be the current that flows into or out of the first end node 106-1 when the first switch circuit 102-1 and the second switch circuit 102-2 are activated, and/or the current that flows into or out of the second end node 106-2 when the first switch circuit 102-1 and the third switch circuit 102-3 are activated. Ion off leakage current may be the current into or out of the second end node 106-2 when the first switch circuit 102-1 and the second switch circuit 102-2 are activated and the third switch circuit 102-3 is deactivated and/or the current into or out of the first end node 106-1 when the first switch circuit 102-1 and the third switch circuit 102-3 are activated and the second switch circuit 102-2 is deactivated.

Figure 1B:
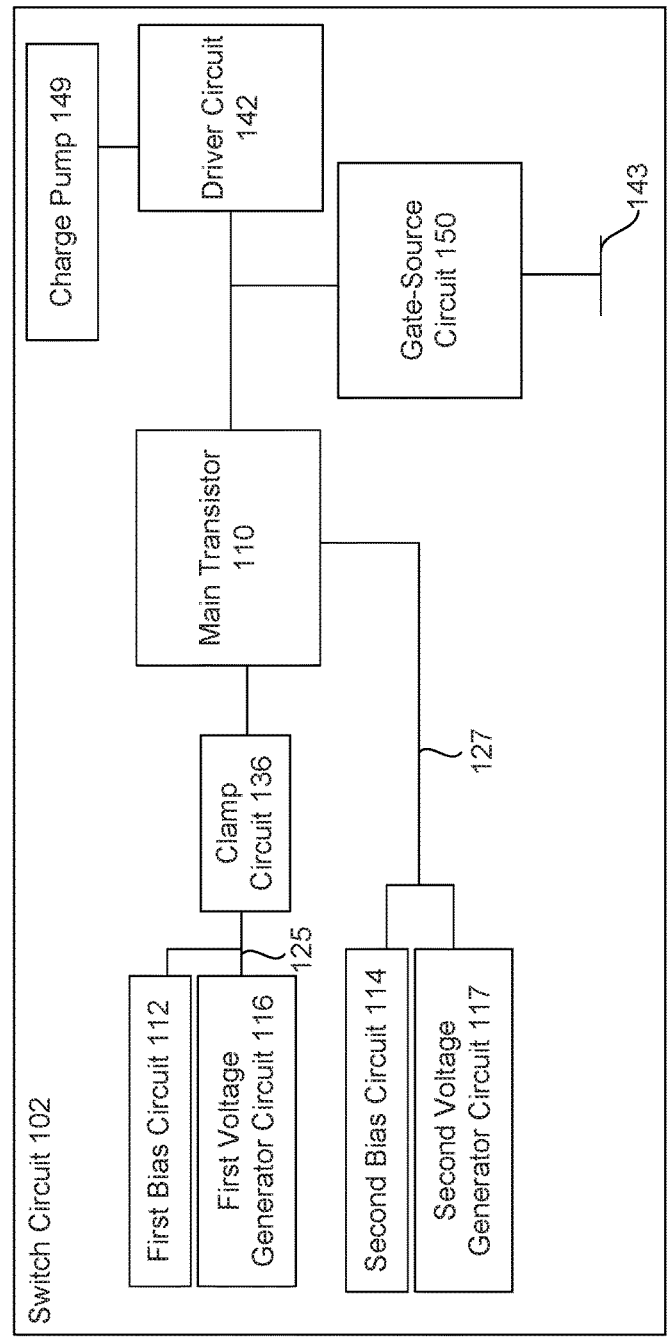
FIG. 1B illustrates a switch circuit of the switch device according to an aspect.

FIG. 1B illustrates a switch circuit 102 according to an aspect. The switch circuit 102 is an example of any of the first switch circuit 102-1, the second switch circuit 102-2, and the third switch circuit 102-3.

The switch circuit 102 includes a main transistor 110, a first voltage generator circuit 116 configured to generate a voltage for a high local rail 125 during an overvoltage event, a second voltage generator circuit 117 configured to generate a voltage for a low local rail 127 during the overvoltage event, a first bias circuit 112 configured to generate a voltage for the high local rail 125 during a normal operation of the switch circuit 102, and a second bias circuit 114 configured to generate a voltage for the low local rail 127 during the normal operation. Also, the switch circuit 102 includes a clamp circuit 136 configured to clamp the voltage between the high local rail 125 and the gate of the main transistor 110, and reduce Ion off leakage current during the normal operation, a gate-source voltage circuit 150 configured to generate a substantially constant gate-source voltage for the main transistor 110 and reduce Ion leakage current during the normal operation of the switch circuit 102, and a driver circuit 142 configured to activate or deactivate the main transistor 110 in response to the overvoltage event.

The first voltage generator circuit 116, the second voltage generator circuit 117, and the clamp circuit 136 are activated and used to protect the main transistor 110 during the overvoltage event. Also, the clamp circuit 136 is configured to reduce (or eliminate) Ion off leakage current during the normal operation. During the normal operation, the gate-source voltage circuit 150 is configured to provide a relatively constant gate source voltage for the main transistor 110 and reduce Ion leakage current by directing a pull-up current to a low rail 143 (not to the low local rail 127).

In some examples, the low rail 143 is considered a most negative rail. The low rail 143 is different than the low local rail 127. Generally, in most instances, the voltage on the low rail 143 is lower than the voltage on the low local rail 127. In some USB applications, the voltage may range from 0 to 3.6V. In some audio applications, the voltage may range from −3.0V to 3.0V. For a USB signal application (e.g., 0-3.6V), the low rail 143 may be the minimum voltage between the ground and the voltage on the common node 104. For example, the low rail 143 may be zero or the voltage on the common node 104, whichever is lower. During the normal operation, since the voltage on the common node 104 is higher than zero, then the voltage on the low rail 143 is zero. During the overvoltage event, the voltage on the low rail 143 is still the minimum voltage between the ground and the voltage on the common node 104, but the voltage on the common node 104 may be a negative voltage such as −20V. If the voltage on the common node 104 is −20V, then the voltage on the low rail 143 is −20V. For an audio signal (e.g., −3.0V to 3.0V), the voltage on the low rail 143 is the minimum voltage between the negative 3.0V (−3.0V generated by the charge pump 149) and the voltage on the common node 104.

The main transistor 110 is considered the main switch or the switch core. In some examples, the main transistor 110 is the switch core device. In some examples, the main transistor 110 is an N-channel metal-oxide-semiconductor field-effect transistor (e.g., NMOS transistor). The main transistor 110 may have a relatively low on-resistance (Ron), and the main transistor 110 may have a relatively large size. When the gate voltage of the main transistor 110 is greater than the drain voltage or the source voltage of the main transistor 110, the main transistor 110 is activated (or turned-on). The main transistor 110 is activated during the normal operation of the switch device 100. When the main transistor 110 is activated, the switch circuit 102 is activated along its switch path, which allows a signal to flow from the drain of the main transistor 110 to the source of the main transistor 110. In some examples, an adjacent switch circuit is connected in series with the switch circuit 102 by connecting the source of the main transistor 110 with the drain of the transistor used as the main switch of the adjacent switch circuit.

When the gate voltage of the main transistor 110 is less than the drain voltage or the source voltage of the main transistor 110, the main transistor 110 is deactivated (or turned-off). The main transistor 110 may be deactivated in response to an overvoltage event (e.g., the voltage on the common node 104 exceeding a threshold level). When the main transistor 110 is deactivated (e.g., in response to the overvoltage event), the switch circuit 102 is deactivated along its switch path and provides high voltage protection so that the switch device 100 can be protected. The bulk of the main transistor 110 is connected to the low local rail 127.

The first bias circuit 112 is configured to receive the drain voltage of the main transistor 110 and the source voltage of the main transistor 110 and generate a voltage on the high local rail 125 during the normal operation based on the drain voltage and the source voltage. For example, the first bias circuit 112 is configured to bias the high local rail 125 during the normal operation. During the normal operation, the first voltage generator circuit 116 and the second voltage generator circuit 117 are deactivated, and the first bias circuit 112 and the second bias circuit 114 are activated. In some examples, during the normal operation, the first bias circuit 112 is configured to provide a voltage of $\frac{1}{2}*(V_S+V_D)$ on the high local rail 125, where $V_S$ is the source voltage of the main transistor 110, and $V_D$ is the drain voltage of the main transistor 110. In some examples, the first bias circuit 112 includes a plurality of transistors.

The second bias circuit 114 is configured to receive the drain voltage of the main transistor 110 and the source voltage of the main transistor 110 and generate a voltage on the low local rail 127 during the normal operation of the switch circuit 102 based on the drain voltage and the source voltage. For example, the second bias circuit 114 is configured to bias the low local rail 127 during the normal operation of the switch circuit 102. In some examples, during the normal operation, the second bias circuit 114 is configured to provide a voltage of voltage of $\frac{1}{2}*(V_S+V_D)$ on the low local rail 127. In some examples, the second bias circuit 114 includes a plurality of transistors.

The first voltage generator circuit 116 and the second voltage generator circuit 117, collectively, are configured to protect the main transistor 110 from incurring a safe operating area (SOA) warning during an overvoltage event. For example, the first voltage generator circuit 116 is configured to generate a voltage for the high local rail 125 during the overvoltage event. The first voltage generator circuit 116 is configured to receive the drain voltage of the main transistor 110 and the source voltage of the main transistor 110 and provide the maximum voltage on the high local rail 125 (e.g., the drain voltage or the source voltage, whichever is larger) during the overvoltage event. For example, if the drain voltage is 14V and the source voltage is 7V, the first voltage generator circuit 116 is configured to provide 14V on the high local rail 125. In some examples, the first voltage generator circuit 116 includes a first transistor and a second transistor, and the first and second transistors define a cross-coupling circuit.

The second voltage generator circuit 117 configured to generate a voltage for the low local rail 127 during the overvoltage event. For example, the second voltage generator circuit 117 is configured to receive the drain voltage of the main transistor 110 and the source voltage of the main transistor 110 and provide the minimum voltage on the low local rail 127 (e.g., the drain voltage or the source voltage, whichever is smaller) during the overvoltage event. For example, if the drain voltage is 14V and the source voltage is 7V, the second voltage generator circuit 117 is configured to provide 7V on the low local rail 127. In some examples, the second voltage generator circuit 117 includes a first transistor and a second transistor, and the first and second transistors define a cross-coupling circuit.

The clamp circuit 136 configured to clamp the voltage between the high local rail 125 and the gate of the main transistor 110, and reduce Ion off leakage current during the normal operation. The clamp circuit 136 is deactivated during the normal operation. For example, the clamp circuit 136 is configured to clamp the voltage between the voltage on the high local rail 125 and the gate voltage of the main transistor 110 during the overvoltage event. The clamp circuit 136 may include a diode. In some examples, the clamp circuit 136 includes a Zener diode and a diode. The clamp circuit 136 may also help with protecting the main transistor 110 from incurring an SOA warning during the overvoltage event.

The driver circuit 142 is configured to activate and deactivate the main transistor 110 (thereby activating or deactivating the switch circuit 102) in response to the overvoltage signal. In some examples, the driver circuit 142 includes an N-channel transistor and a P-channel transistor. In some examples, the P-channel transistor may be coupled to a charge pump 149. The charge pump 149 is configured as a voltage source (e.g., 10V voltage source).

The gate-source voltage circuit 150 is configured to generate a constant gate-source voltage for the main transistor 110 and reduce Ion leakage current during the normal operation. The gate-source voltage circuit 150 may include a first diode and a transistor (e.g., low threshold voltage PMOS transistor). The gate-source voltage circuit 150 may be connected to the low local rail 127 and the low rail 143. The gate-source voltage circuit 150 may clamp the gate voltage of the main transistor 110 and the voltage of $\frac{1}{2}*(V_S+V_D)$ to provide a constant gate-source voltage for the main transistor 110, where $V_S$ is the source voltage of the main transistor 110, and $V_D$ is the drain voltage of the main transistor 110. In some examples, the gate-source voltage circuit 150 may include a second diode and a resistor. The second diode may be configured to clamp the gate and the drain of the transistor of the gate-source voltage circuit 150 during the overvoltage event, which can protect the transistor of the gate-source voltage circuit 150 from incurring an SOA warning. The resistor may be used limit the current to the second diode during the overvoltage event.

During the normal operation, the P-channel transistor of the driver circuit 142 is activated and the N-channel transistor of the driver circuit 142 is deactivated. The pull-up current (provided by the charge pump 149) charges the gate of the main transistor 110, and the main transistor 110 becomes activated. During the normal operation, the gate-source voltage circuit 150 is configured to clamp the gate voltage and the voltage of $\frac{1}{2}*(V_S+V_D)$ of the main transistor 110 to provide the constant gate-source voltage for the main transistor 110. In some examples, the clamped voltage is less than 6.6V (where the main transistor 110 is in the safe region). Also, the gate-source voltage circuit 150 is used to direct the pull-up current to the low rail 143. As a result, the switch circuit 102 can achieve no Ion leakage current (or reduced Ion leakage current) during the normal operation. In some examples, the Ion leakage current is less than 15 nA. During the normal operation, the voltage on the high local rail 125 is $\frac{1}{2}*(V_S+V_D)$, and the voltage on the low local rail 127 is $\frac{1}{2}*(V_S+V_D)$.

When an overvoltage is applied on the common node 104, the overvoltage protection circuit is triggered to deactivate the main transistor 110. In this situation, the P-channel transistor of the driver circuit 142 is deactivated and the N-channel transistor of the driver circuit 142 is activated, in order to deactivate the main transistor 110. The first voltage generator circuit 116, the second voltage generator circuit 117, and the clamp circuit 136 are activated to protect the main transistor 110 from incurring an SOA warning during the overvoltage event. During the overvoltage event, the current flows from the high local rail 125 to the clamp circuit 136, to the N-channel transistor of the driver circuit 142, and to the low rail 143.

During the overvoltage event, the second voltage generator circuit 117 provides the minimum voltage between the source voltage and drain voltage of the main transistor 110 for the low local rail 127, and the low local rail 127 biases the bulk of the main transistor 110. The main transistor 110 clamps the voltage on the source to $V_G-V_{th}$, where $V_G$ is the gate voltage of the main transistor 110 and $V_{th}$ is the threshold voltage of the main transistor 110. During the overvoltage event, the first voltage generator circuit 116 provides the maximum voltage between the source voltage and the drain voltage of the main transistor 110 for the high local rail 125.

Figure 2A:
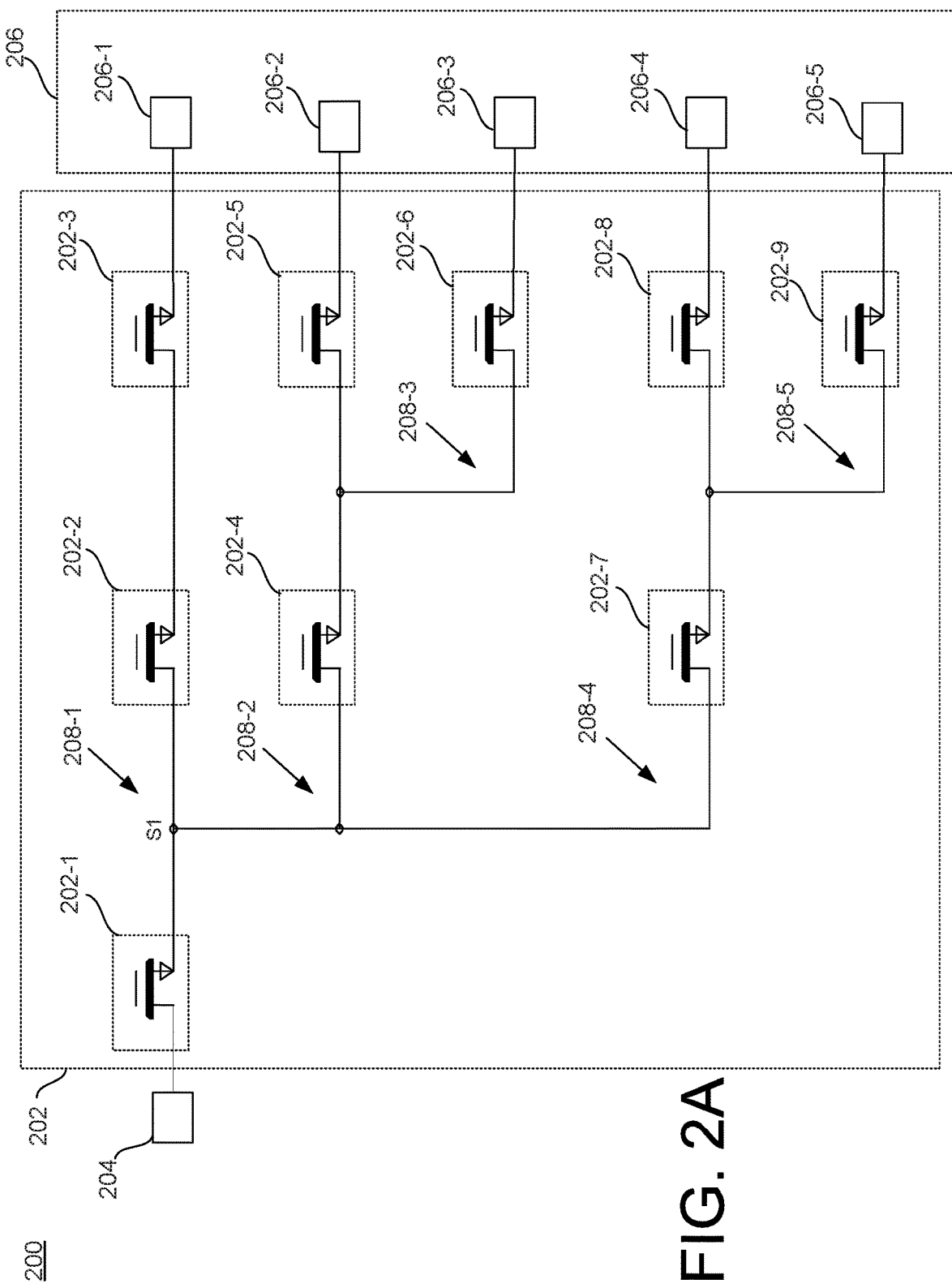
FIG. 2A illustrates a switch device according to an aspect.

FIG. 2A illustrates a switch device 200 according to an aspect. The switch device 200 may include any of the features discussed with reference to the switch device 100 of FIG. 1A. In some examples, the switch device 200 includes a connector-side Universal Serial Bus (USB) switch device. In some examples, the switch device 200 includes a micro-USB switch (MUS) device. The switch device 200 is configured to selectively connect a common node 204 to one or more end nodes 206 using switch circuits 202. The switch circuits 202 may be low voltage devices that provide high voltage protection in the case of a DC voltage surge in a manner that reduces (or eliminates) Ion leakage current and Ion off leakage current.

The common node 104 may be a pin, a pad, or a terminal. In some examples, the common node 104 is a communication pin (e.g., com pin) or host pin on the connector side. In some examples, the common node 104 is a negative data terminal (DM) and/or a positive data terminal (DP). The end nodes 206 may be output ports. In some examples, the end nodes 206 are computer interface ports that interface with a USB connector on a device. The end nodes 206 may be pins, pads, or terminals. In some examples, the end nodes 206 include one or more audio ports and one or more USB ports. In some examples, the end nodes 206 include an audio port 206-1, a first USB port 206-2, a second USB port 206-3, a first receiver/transmitter port 206-4, and a second receiver/transmitter port 206-5.

The switch device 200 includes a plurality of switch paths that selectively connect the common node 204 to one or more of the end nodes 206. For example, the common node 204 is selectively connected to the audio port 206-1 via a first switch path 208-1 defined by series-connected switch circuits such as a first switch circuit 202-1, a second switch circuit 202-2, and a third switch circuit 202-3. For example, in response to each of the first switch circuit 202-1, the second switch circuit 202-2, and the third switch circuit 202-3 being activated (or turned-on), the common node 204 is electrically connected to the audio port 206-1. In response to at least one of the first switch circuit 202-1, the second switch circuit 202-2, and the third switch circuit 202-3 being deactivated (or turned-off), the common node 204 is not electrically coupled (e.g., isolated) from the audio port 206-1.

The common node 204 is selectively connected to the first USB port 206-2 via a second switch path 208-2 defined by series-connected switch circuits such as the first switch circuit 202-1, a fourth switch circuit 202-4, and a fifth switch circuit 202-5. The common node 204 is selectively connected to the second USB port 206-3 via a third switch path 208-3 defined by series-connected switch circuits such as the first switch circuit 202-1, the fourth switch circuit 202-4, and a sixth switch circuit 202-6. The common node 204 is selectively connected to the first receiver/transmitter port 206-4 via a fourth switch path 208-4 defined by series-connected switch circuits such as the first switch circuit 202-1, a seventh switch circuit 202-7, and an eight switch circuit 202-8. The common node 204 is selectively connected to the second receiver/transmitter port 206-5 via a fifth switch path 208-5 defined by series-connected switch circuits such as the first switch circuit 202-1, the seventh switch circuit 202-7, and a ninth switch circuit 202-9. In some examples, the switch device 200 includes switch paths greater than five. In some examples, the switch device 200 includes switch paths less than five.

Figure 2B:
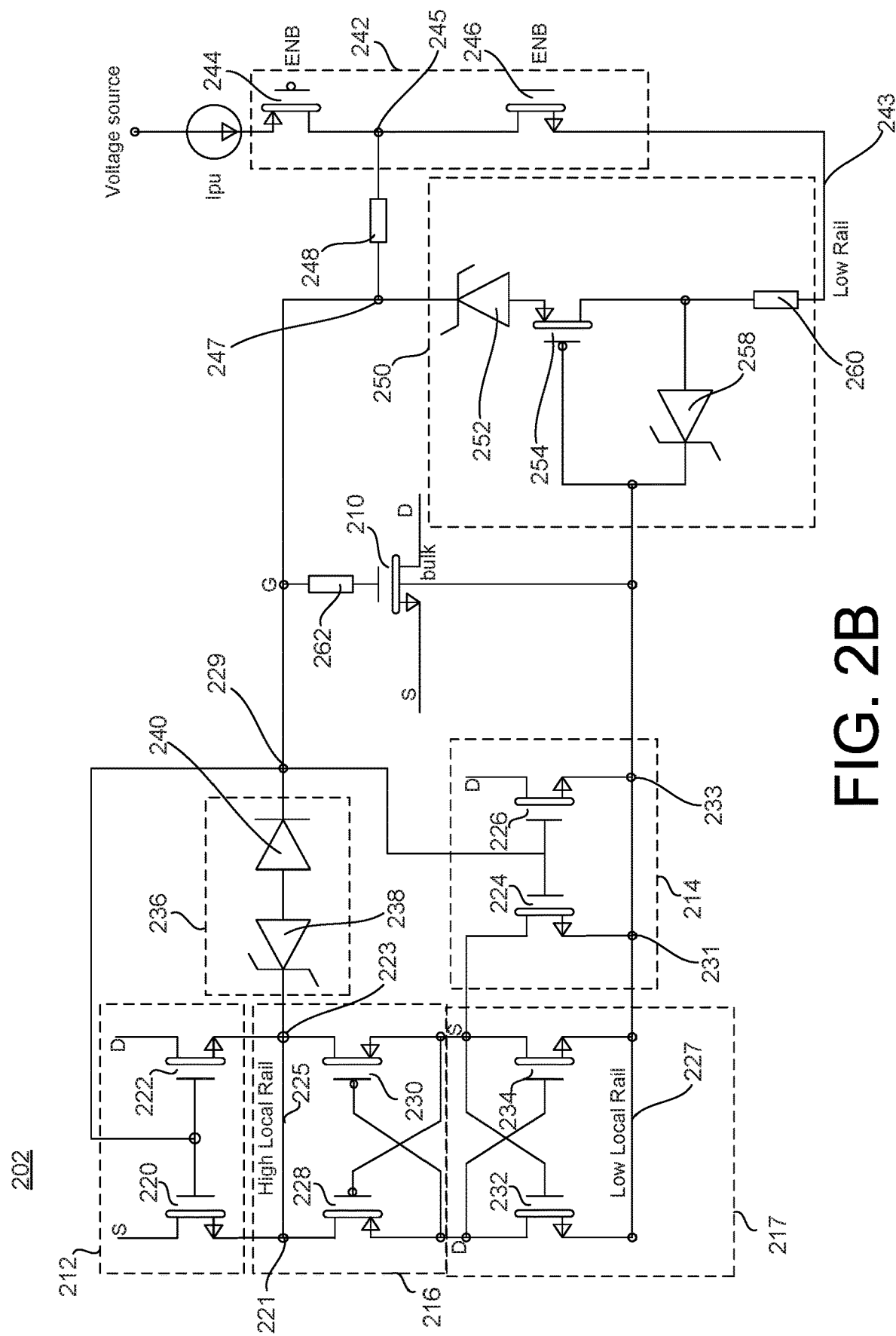
FIG. 2B illustrates a switch circuit of the switch device according to an aspect.

In FIG. 2A, each of the switch circuits 202 is represented by its main switch (shown as main transistor 210 in FIG. 2B). The main switch may include a low voltage NMOS or PMOS transistor with high voltage isolation. In some examples, the main switch may include an isolated NMOS switch device. In some examples, the main switch is an electrostatic discharge (ESD) protection type of transistor. Activating a particular switch circuit 202 actives its main switch to allow a signal to flow between the source and the drain of the main switch. A plurality of switch circuits 202 may be connected in series by connecting the source of the main switch of a switch circuit 202 to the drain of the main switch of an adjacent switch circuit 202, and so forth. In some examples, a switch circuit 202 provides high voltage surge protection along a switch path.

The main switch of a particular switch circuit 202 may be part of a switch core. The gate voltage of the transistor (e.g., main transistor 210 of FIG. 2B) that is being used as the main switch is controlled by the switch circuit 202 in order to deactivate the switch circuit 202 in response to a DC voltage surge (or overvoltage event). In some examples, each switch circuit 202 is configured to drop a particular voltage, which may depend on the component parameters of the switch circuit 202. The number of switch circuits 202 on a switch path may thus dictate the surge protection along the switch path. For example, assuming that each switch circuit 202 is configured to drop 8 volts, a switch path with three series-connected switch circuits 202 can protect the switch path against a 24V surge.

FIG. 2B illustrates a switch circuit 202 according to an aspect. The switch circuit 202 may include any of the features discussed with reference to the switch circuit 102 of FIG. 1B. The switch circuit 202 of FIG. 2B is an example of any one of the switch circuits 202 of FIG. 2A. Referring to FIG. 2B, the switch circuit 202 includes a main transistor 210 (e.g. the main switch), a first voltage generator circuit 216 configured to generate a voltage for a high local rail 225 during the overvoltage event, a second voltage generator circuit 217 configured to generate a voltage for a low local rail 227 during the overvoltage event, a first bias circuit 212 configured to generate a voltage for the high local rail 225 during the normal operation, and a second bias circuit 214 configured to generate a voltage for the low local rail 227 during the normal operation.

The switch circuit 202 also includes a clamp circuit 236 configured to clamp the voltage between the high local rail 225 and the gate of the main transistor 210, and reduce Ion off leakage current during the normal operation of the switch circuit 202, a gate-source voltage circuit 250 configured to generate a constant gate-source voltage for the main transistor 210 and reduce Ion leakage current during the normal operation of the switch circuit 202, a driver circuit 242 configured to activate or deactivate the main transistor 210 in response to an enable signal ENB, a resistor 248 connected to the driver circuit 242 that is used to limit the current during the overvoltage event, and a resistor 262 connected to the gate of the main transistor 210 that is used for ESD protection.

The first voltage generator circuit 216, the second voltage generator circuit 217, and the clamp circuit 236 are activated and used to protect the main transistor 210 during the overvoltage event. Also, the clamp circuit 236 is configured to reduce (or eliminate) Ion off leakage current during the normal operation. During the normal operation, the gate-source voltage circuit 250 is configured to provide a constant gate source voltage for the main transistor 210 and reduce Ion leakage current by directing a pull-up current Ipu to a low rail 243 (not to the low local rail 227).

The main transistor 210 is considered the main switch or the switch core. In some examples, the main transistor 210 is the switch core device. In some examples, the main transistor 210 is an N-channel transistor (e.g., NMOS transistor). The main transistor 210 may have a relatively low on-resistance (Ron), and the main transistor 210 may have a relatively large size. When the gate voltage of the main transistor 210 is greater than the drain voltage or the source voltage of the main transistor 210, the main transistor 210 is activated (or turned-on). The main transistor 210 is activated during the normal operation of the switch device 200. When the main transistor 210 is activated, the switch circuit 202 is activated along its switch path, which allows a signal to flow from the drain of the main transistor 210 to the source of the main transistor 210. An adjacent switch circuit is connected in series with the switch circuit 202 by connecting the source of the main transistor 210 with the drain of the transistor used as the main switch of the adjacent switch circuit.

When the gate voltage of the main transistor 210 is less than the drain voltage or the source voltage of the main transistor 210, the main transistor 210 is deactivated (or turned-off). The main transistor 210 may be deactivated in response to an overvoltage event (e.g., the voltage on the common node 204 exceeding a threshold level). When the transistor is deactivated (e.g., in response to the overvoltage event), the switch circuit 202 is deactivated along its switch path and provides high voltage protection so that the switch device 200 can be protected. The bulk of the main transistor 210 is connected to the low local rail 227. The source of the main transistor 210 and the drain of the main transistor 210 are connected to various parts of the switch circuit 202 as shown by the labels S and D.

The first bias circuit 212 is configured to generate a voltage on the high local rail 225 during the normal operation (e.g., the enable signal ENB is in a logic low state). For example, the first bias circuit 212 is configured to bias the high local rail 225 during the normal operation. Otherwise, the node of the high local rail 225 is a high impedance node because the source voltage and the drain voltage of the main transistor 210 are substantially the same. During the normal operation, the first voltage generator circuit 216 and the second voltage generator circuit 217 are deactivated, and the first bias circuit 212 and the second bias circuit 214 are activated. During the normal operation, the first bias circuit 212 is configured to provide a voltage of $\frac{1}{2}*(V_S+V_D)$ on the high local rail 225, where $V_S$ is the source voltage of the main transistor 210, and $V_D$ is the drain voltage of the main transistor 210.

The first bias circuit 212 includes a transistor 220 and a transistor 222. In some examples, the transistor 220 is an N-channel transistor, and the transistor 222 is an N-channel transistor. The gate of the transistor 220 is connected to the gate of the transistor 222. Also, the gates of the transistor 220 and the transistor 222 are connected to a node 229 that is connected to the gate of the main transistor 210. The transistor 220 and the transistor 222 are activated during the normal operation of the switch circuit 202. The transistor 220 and the transistor 222 are deactivated during the overvoltage event. The drain of the transistor 220 is connected to the source of the main transistor 210, and the drain of the transistor 222 is connected to the drain of the main transistor 210. The source of the transistor 220 is connected to a node 221 on the high local rail 225, and the source of the transistor 222 is connected to a node 223 on the high local rail 225.

The second bias circuit 214 is configured to generate a voltage on the low local rail 227 during the normal operation of the switch circuit 202. For example, the second bias circuit 214 is configured to bias the low local rail 227 during the normal operation of the switch circuit 202. Otherwise, the node of the low local rail 227 is a high impedance node because the source voltage and the drain voltage of the main transistor 210 are substantially the same. During the normal operation, the second bias circuit 214 is configured to provide a voltage of $\frac{1}{2}*(V_S+V_D)$ on the Low Local Rail 227.

The second bias circuit 214 includes a transistor 224 and a transistor 226. In some examples, the transistor 224 is an N-channel transistor, and the transistor 226 is an N-channel transistor. The gate of the transistor 224 is connected to the gate of the transistor 226. Also, the gates of the transistor 224 and the transistor 226 are connected to the node 229. The transistor 224 and the transistor 226 are activated during the normal operation, but deactivated during the overvoltage event. The drain of the transistor 224 is connected to the source of the main transistor 210, and the drain of the transistor 226 is connected to the drain of the main transistor 210. The source of the transistor 224 is connected to a node 231 on the low local rail 227, and the source of the transistor 226 is connected to a node 233 on the low local rail 227.

The first voltage generator circuit 216, the second voltage generator circuit 217, the clamp circuit 236, the resistor 248, and the driver circuit 242, collectively, are configured to protect the main transistor 210 from incurring a safe operating area (SOA) warning during an overvoltage event. Protection against the SOA warning means that the difference between each two terminals of the main transistor 210 is lower than the breakdown voltage (e.g., 8V). For example, the first voltage generator circuit 216 is configured to generate a voltage for the high local rail 225 during the overvoltage event. The first voltage generator circuit 216 is configured to receive the drain voltage of the main transistor 210 and the source voltage of the main transistor 210 and provide the maximum voltage on the high local rail 225 (e.g., the drain voltage or the source voltage, whichever is larger) during the overvoltage event. For example, if the drain voltage is 14V and the source voltage is 7V, the first voltage generator circuit 216 is configured to provide 14V on the high local rail 225.

The first voltage generator circuit 216 includes a transistor 228 and a transistor 230. The transistor 228 and the transistor 230 are activated during the overvoltage event, but deactivated during the normal operation. In some examples, the transistor 228 is a P-channel transistor, and the transistor 230 is a P-channel transistor. The transistor 228 and the transistor 230 form a cross-coupling circuit. The drain of the transistor 228 is connected to the node 221 on the high local rail 225, and the drain of the transistor 230 is connected to the node 223 on the high local rail 225. The gate of the transistor 228 is connected to the source of the main transistor 210, and the gate of the transistor 230 is connected to the drain of the main transistor 210. The gate of the transistor 228 is connected to the source of the transistor 230, and the gate of the transistor 230 is connected to the source of the transistor 228. The source of the transistor 228 is connected to the drain of the main transistor 210, and the source of the transistor 230 is connected to the source of the main transistor 210.

The second voltage generator circuit 217 configured to generate a voltage for the low local rail 227 during the overvoltage event. For example, the second voltage generator circuit 217 is configured to receive the drain voltage of the main transistor 210 and the source voltage of the main transistor 210 and provide the minimum voltage on the low local rail 227 (e.g., the drain voltage or the source voltage, whichever is smaller) during the overvoltage event. For example, if the drain voltage is 14V and the source voltage is 7V, the second voltage generator circuit 217 is configured to provide 7V on the low local rail 227.

The second voltage generator circuit 217 includes a transistor 232 and a transistor 234. The transistor 232 and the transistor 234 are activated during the overvoltage event, but deactivated during the normal operation. In some examples, the transistor 232 is an N-channel transistor, and the transistor 234 is an N-channel transistor. The transistor 232 and the transistor 234 form a cross-coupling circuit. The source of the transistor 232 is connected to the low local rail 227, and the source of the transistor 234 is connected to the low local rail 227. The drain of the transistor 232 is connected to the drain of the main transistor 210, and the drain of the transistor 234 is connected to the source of the main transistor 210. The gate of the transistor 232 is connected to the source of the main transistor 210 and the drain of the transistor 234, and the gate of the transistor 234 is connected to the drain of the main transistor 210 and the drain of the transistor 232.

The clamp circuit 236 is configured to clamp the voltage between the high local rail 225 and the gate of the main transistor 210. In some examples, the clamp circuit 236 may reduce Ion off leakage current during the normal operation. The clamp circuit 236 is deactivated during the normal operation. The clamp circuit 236 may be disposed on the high local rail 225 between the first voltage generator circuit 216 and the gate of the main transistor 210. The clamp circuit 236 may be connected to the node 223 and the node 229. The clamp circuit 236 includes a diode 238 disposed in parallel with a diode 240. The diode 238 may be a Zener diode. The clamp circuit 236 is configured to clamp the voltage between the voltage on the high local rail 225 and the gate voltage of the main transistor 210. For example, when $(V_{HLR}-V_G)>(V_{238}+V_{240})$, the diode 238 and the diode 240 activate, where $V_{HLR}$ is the voltage on the high local rail 225, $V_G$ is the gate voltage of the main transistor 210, $V_{238}$ is the voltage threshold of the diode 238, and $V_{240}$ is the voltage threshold of the diode 240. Then, there may be a low impedance path between the high local rail 225 and the gate of the main transistor 210, and the low impedance path may ensure that $V_{HLR}-V_G$ is below or equal to a target amount (e.g., 6.0V). Also, it is noted that the resistor 262 for ESD protection is very small (e.g., about 200 ohm), so that the voltage across its two terminals is very small (e.g., 0V). The clamp circuit 236 may also help with protecting the main transistor 210 from incurring an SOA warning during the overvoltage event.

The driver circuit 242 is configured to activate and deactivate the main transistor 210 (thereby activating or deactivating the switch circuit 202) in response to the enable signal ENB. The enable signal ENB may be provided by an overvoltage protection circuit. The driver circuit 242 includes a transistor 244 and a transistor 246. The transistor 244 includes a high voltage P-channel transistor. The transistor 246 includes a high voltage N-channel transistor. When the enable signal ENB is in a first state (e.g., a logic low state), the transistor 244 is activated and the transistor 246 is deactivated. When the enable signal ENB is in a second state (e.g., a logic high state), the transistor 244 is deactivated and the transistor 246 is activated. The source of the transistor 244 is coupled to a power source (e.g., 10V charge pump) that provides a pull-up current Ipu during the normal operation. The drain of the transistor 244 is connected to a node 245. The drain of the transistor 246 is connected to the node 245, and the source of the transistor 246 is connected to a low rail 243. The gate of the transistor 244 is configured to receive the enable signal ENB, and the gate of the transistor 246 is configured to receive the enable signal ENB. The resistor 248 includes a first terminal connected to the node 245 and a second terminal connected to a node 247.

The gate-source voltage circuit 250 is configured to generate a constant gate-source voltage $V_{GS}$ for the main transistor 210 and reduce Ion leakage current during the normal operation. The gate-source voltage circuit 250 includes a diode 252 and a transistor 254. The diode 252 may be a Zener diode. The diode 252 is connected to the node 247 and the source of the transistor 254. The transistor 254 may be a low threshold voltage PMOS transistor. In some examples, the voltage threshold of the transistor 254 may be relatively smaller than a voltage threshold of a normal PMOS transistor to ensure that $[V_G-\frac{1}{2}(V_S+V_D)]$ is less than 6.5V, where $V_G$ is the gate voltage of the main transistor 210, $V_S$ is the source voltage of the main transistor 210, and $V_D$ is the drain voltage of the main transistor 210. The gate of the transistor 254 is connected to the low local rail 227, and the drain of the transistor 254 is connected to the low rail 243 (or to a resistor 260 that is coupled to the low rail 243).

The diode 252 and the transistor 254 are configured to clamp the gate voltage of the main transistor 210 and $\frac{1}{2}*(V_S+V_D)$ to provide a constant gate-source voltage $V_{GS}$ for the main transistor 210, where $V_S$ is the source voltage of the main transistor 210, and $V_D$ is the drain voltage of the main transistor 210. When the enable signal ENB is in the first logic state (e.g., logic low state), the transistor 244 is activated and the transistor 246 is deactivated. The pull-up current Ipu flows through the resistor 248, the diode 252, the transistor 254, and to the low rail 243. The low rail 243 may be coupled to ground. Since the pull-up current Ipu flows to the low rail 243 (not to the low local rail 227), the Ion leakage current may be reduced.

The gate-source voltage circuit 250 may include a diode 258 and a resistor 260. The diode 258 is configured to clamp the gate and the drain of the transistor 254 during the overvoltage event, which can protect the transistor 254 from incurring an SOA warning. The diode 258 is not used during the normal operation. The diode 258 is connected to the gate of the transistor 254 and the drain of the transistor 254. The resistor 260 is configured to limit the current to the diode 258 during the overvoltage event. The resistor 260 is connected to the drain of the transistor 254 and the low rail 243.

During the normal operation, when the enable signal ENB is in the first state (e.g., logic low state), the transistor 244 is activated and the transistor 246 is deactivated. The pull-up current Ipu charges the gate of the main transistor 210, and the main transistor 210 becomes activated. In response to the enable signal ENB transitioning to the second logic state (e.g., logic high state), the transistor 244 is deactivated and the transistor 246 is activated, and the main transistor 210 becomes deactivated. During the normal operation, the diode 252 and the transistor 254 are configured to clamp the gate voltage and $\frac{1}{2}*(V_S+V_D)$ of the main transistor 210 to provide the constant gate-source voltage for the main transistor 210. In some examples, the clamped voltage is less than 6.6V (where the main transistor 210 is in the safe region). Also, the diode 252 and the transistor 254 are used to direct the pull-up current IPU to the low rail 243 (not to the end nodes 206). As a result, the switch circuit 202 can achieve no Ion leakage current (or reduced Ion leakage current) during the normal operation. In some examples, the Ion leakage current is less than 15 nA. During the normal operation, the voltage on the high local rail 225 is $\frac{1}{2}*(V_S+V_D)$, and the voltage on the low local rail 227 is $\frac{1}{2}*(V_S+V_D)$. During the normal operation, the diode 258, the diode 238, the diode 240, the transistor 232, the transistor 234, the transistor 228, and the transistor 230 are deactivated.

When an overvoltage is applied on the common node 204, the overvoltage protection circuit is triggered to deactivate the main transistor 210. In this situation, the transistor 220, the transistor 222, the transistor 224, the transistor 226, and the transistor 244 are deactivated, and the enable signal ENB transitions to the second logic state to activate the transistor 246. The transistor 228, the transistor 230, the transistor 232, the transistor 234, the diode 238, the diode 240, and the transistor 246 are activated, and are used to protect the main transistor 210 from the SOA warning region (e.g., reduces the voltage to be within the safe operating range), and the diode 258 and the resistor 260 are used to protect the transistor 254 from SOA warning region (e.g., reduces the voltage to be within the safe operating range). The resistor 248 limits the current from the high local rail 225 during the overvoltage event. During the overvoltage event, the current flows from the high local rail 225 to the diode 238, to the diode 240, to the resistor 248, to the transistor 246, to the low rail 243.

During the overvoltage event, the transistor 232 and the transistor 234 provide the minimum voltage between the source voltage and drain voltage of the main transistor 210 for the low local rail 227, and the low local rail 227 biases the bulk of the main transistor 210. The main transistor 210 clamps the voltage on its source to $V_G-V_{th}$, where $V_G$ is the gate voltage of the main transistor 210 and $V_{th}$ is the threshold voltage of the main transistor 210. During the overvoltage event, the transistor 228 and the transistor 230 provide the maximum voltage between the source voltage and the drain voltage of the main transistor 210 for the high local rail 225. For example, if the drain voltage is 14V and the source voltage is 7V, the voltage on the high local rail 225 is 14V and the voltage on the low local rail 227 is 7V. Also, the switch circuit 202 includes a clamp path (through the diode 238 and the diode 240) between the high local rail 225 and the gate of the main transistor 210. The diode 258 is configured to protect the transistor 254 from the SOA warning region, and the resistor 260 is configured to limit the current through the transistor 254.

Figure 2C:
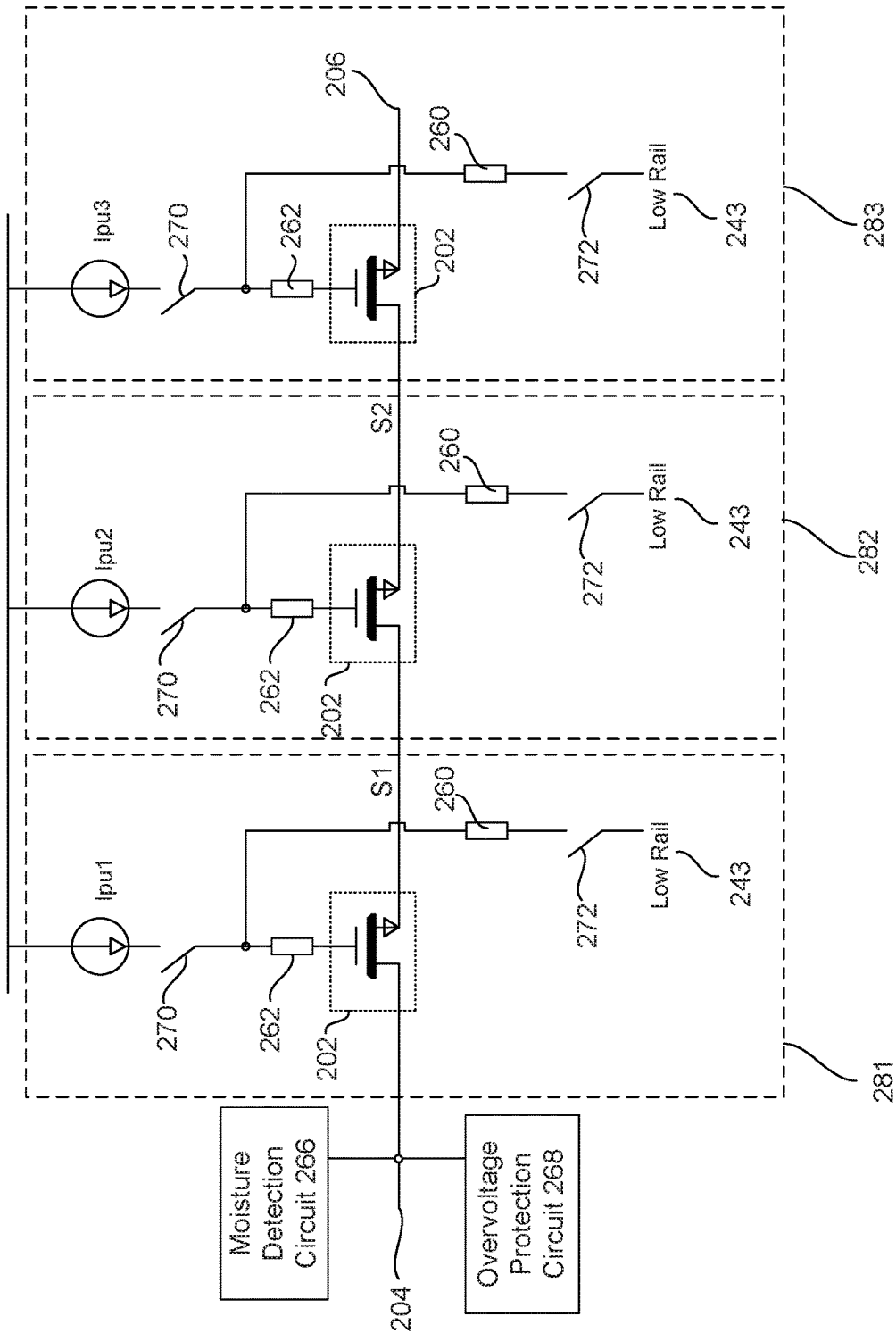
FIG. 2C illustrates a switch path of the switch device according to an aspect.

FIG. 2C illustrates a switch path 208 of the switch device 200 of FIG. 2A having a first protection stage 281, a second protection stage 282, and a third protection stage 283 according to an aspect. The switch path 208 is disposed between the common node 204 and the end node 206. Each of the first protection stage 281, the second protection stage 282, and the third protection stage 283 provides a different stage of protection for the switch device 200 along the switch path.

Referring to FIGS. 2B and 2C, the first protection stage 281 includes the switch circuit 202 (represented by its main switch, e.g., the main transistor 210 of FIG. 2B), the resistor 262 connected to the gate of the main transistor 210, and the resistor 260 disposed between the gate of the main transistor 210 and the low rail 243. The first protection stage 281 includes a switch 270 configured to selectively couple the pull-up current Ipu to the gate of the main transistor 210. The pull-up current Ipu may be generated by a charge pump (e.g., a 10V charge pump). Also, the first protection stage 281 includes a switch 272 configured to selectively couple the low rail 243 to the gate of the main transistor 210. Since the second protection stage 282 and the third protection stage 283 include the same components as the first protection stage 281, the details of the second protection stage 282 and the third protection stage 283 are omitted for the sake of brevity.

The switch device 200 includes a moisture detection circuit 266 coupled to the common node 204. The moisture detection circuit 266 is configured to detect the presence of moisture on the common node 204. Because the switch circuit 202 reduces the leakage currents (e.g., Ion leakage current, Ion off leakage current), the moisture detection circuit 266 can function properly. In some USB applications, the moisture may cause a 20V VBUS pin to be short to configuration channel (CC) pin, sideband use (SBU) pin, or another pin(s). If the CC pin and the SBU pin do not survive under the 20V, then these pins will be damaged. Ion leakage current may influence the moisture detection especially for voltages on the common node 204 that are less than 1V. However, the switch device 200 discussed herein may reduce (or eliminate) Ion leakage current (especially for voltages on the common node 204 that are less than 1V) so that moisture detection by the moisture detection circuit 266 can properly function.

FIG. 2D illustrates the moisture detection circuit 266 according to an aspect. The moisture detection circuit 266 may include a pull-up resistor 290 and a moisture resistor 292. The common node 204 is disposed between the pull-up resistor 290 and the moisture resistor 292. The pull-up resistor 290 is configured to receive a voltage from a voltage source (e.g., a class AB buffer—not shown). In some examples, the pull-up resistor 290 has a resistance in the range of 250K ohm to 400K ohm. In some examples, the resistance of the pull-up resistor 290 is 320K ohm. The moisture detection circuit 266 includes an analog-to-digital converter (ADC) 294 connected to the common node 204. The ADC 294 is configured to generate an ADC output code.

Moisture in the air may be modelled by the moisture resistor 292. In some examples, the moisture resistor 292 may have a resistance in the range of 10K ohm to 1.28M ohm. The higher the moisture resistance, the dryer the air. In some examples, when there is water in the common node 204, the moisture resistance may be relatively low. The type of application may define the moisture threshold. In some examples, the moisture threshold is 100K ohm (however, the moisture threshold is highly dependent on the type of application). When there is moisture in the air or on the common node 204, the moisture resistance of the moisture resistor 292 between the common node 204 and ground is less than the moisture threshold of 100K ohm. For example, based on the ADC output code, the resistance for the moisture resistor 292 is obtained. If the resistance for the moisture resistor 292 is lower than the moisture threshold resistor of 100K ohm, then moisture exists in the air or on the common node 204, and the switch device 200 is deactivated.

Referring to FIG. 2C, the switch device 200 includes an overvoltage protection circuit 268 coupled to the common node 204. The overvoltage protection circuit 268 is configured to determine detect a voltage on the common node 204. In response to the voltage on the common node 204 exceeding a threshold level, the overvoltage protection circuit 268 is configured to generate the enable signal ENB (e.g., the second state of the enable signal ENB or a logic high state of the enable signal ENB), which indicates an overvoltage event, in order to deactivate the main transistor 210 of the first protection stage 281, the second protection stage 282, and the third protection stage 283. When the overvoltage protection circuit 268 is triggered (e.g., the voltage on the common node 204 exceeds the threshold level), the overvoltage protection circuit 268 is configured to activate (turn-on) on the switch 272 for each of the stages, and deactivate the switch 270 for each of the stages.

Figure 3:
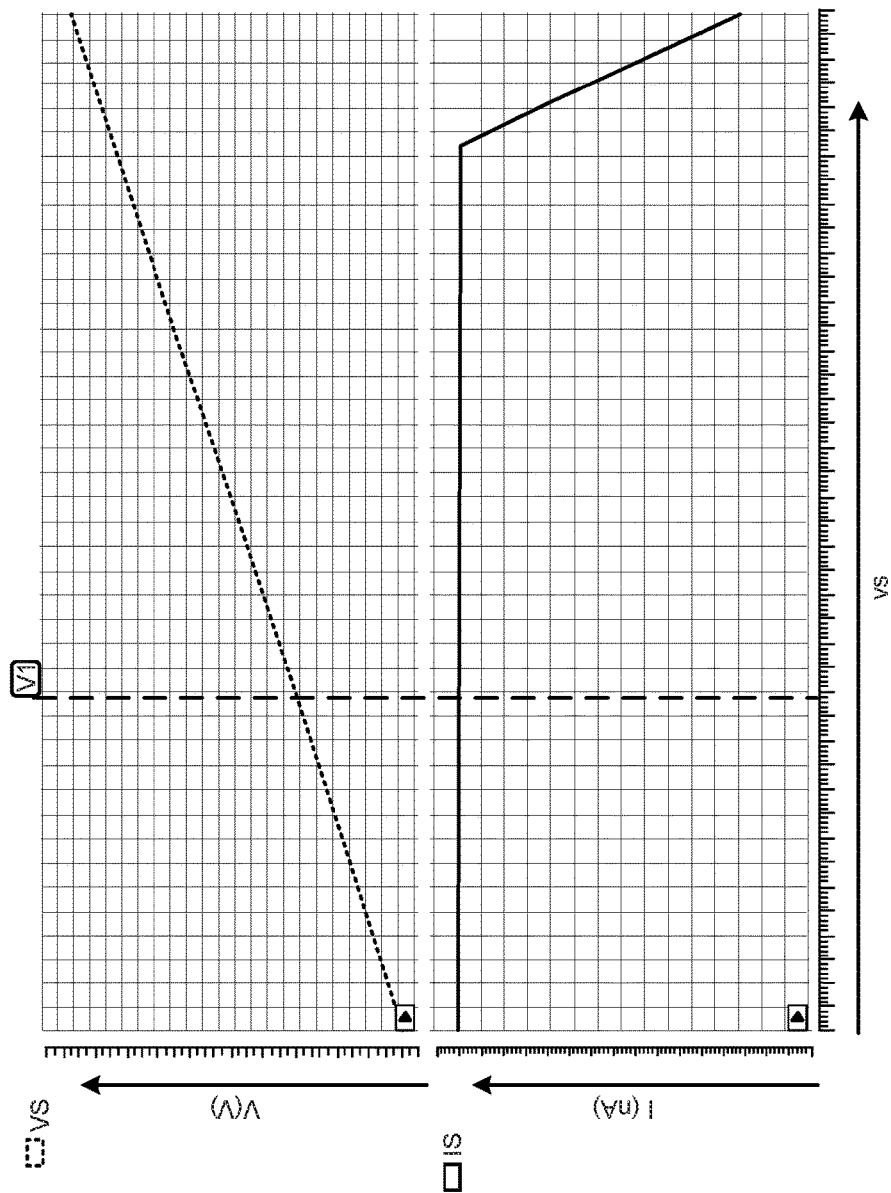
FIG. 3 illustrates an Ion leakage current simulation according to an aspect.

FIG. 3 illustrates an Ion leakage current simulation 300 for a switch device according to an aspect. The Ion leakage current simulation 300 depicts the Ion leakage current (I (nA)) for a DC sweep of the voltage ($V_S$) of the common node 204. In some examples, the Ion leakage current for the switch device is less than 15 nA. In some examples, when the voltage ($V_S$) at the common node 204 is 1.4V, the Ion leakage current is 4 pA.

Figure 4:
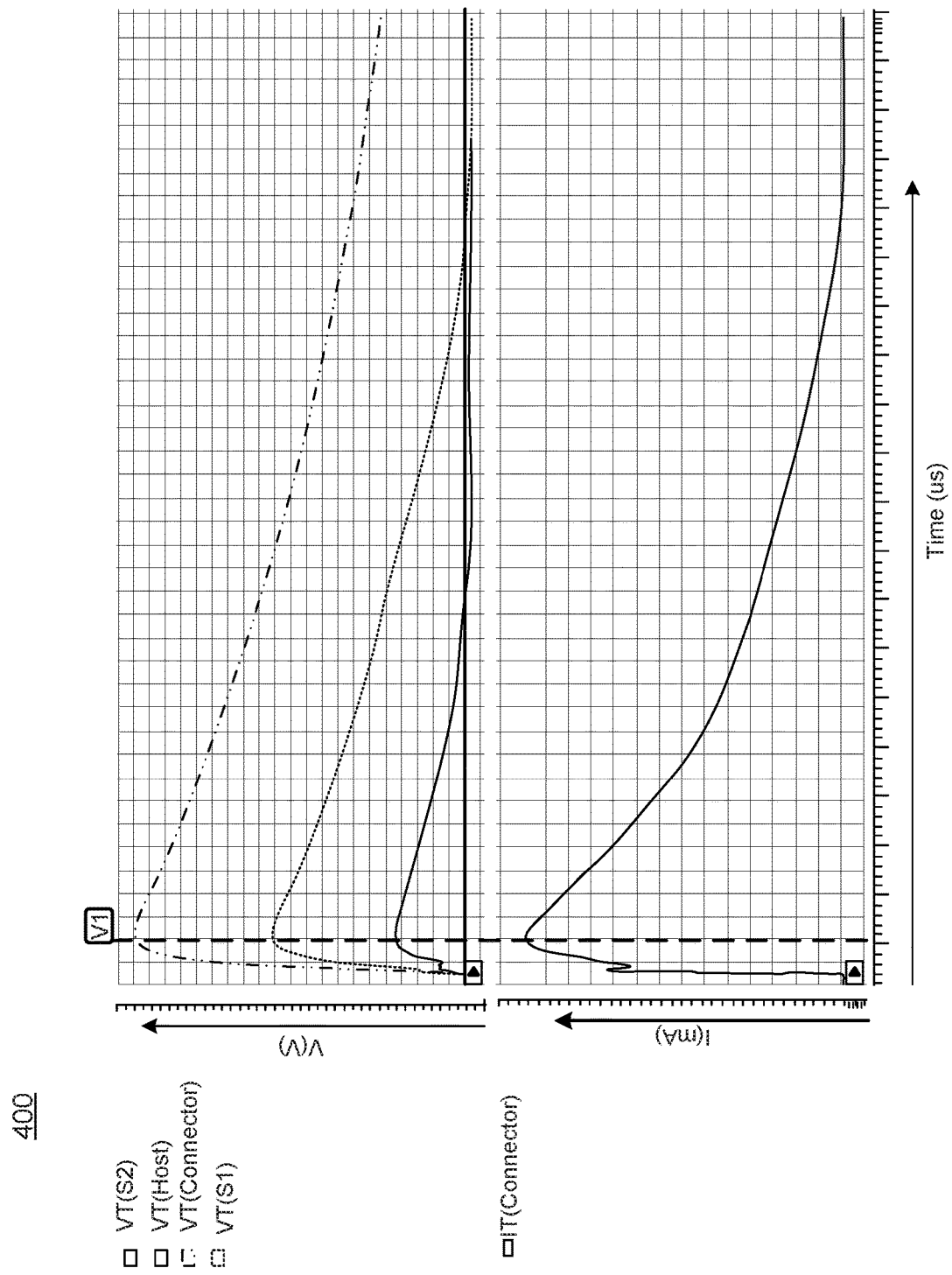
FIG. 4 illustrates a graph depicting results of a positive surge test according to an aspect.

FIG. 4 illustrates a positive 20V surge test 400 for a switch device according to an aspect. For example, when a positive 20V is applied at the common node 204, the positive 20V surge test 400 depicts the voltage at the common node 204 (VT(Connector)), the voltage at S1 (see FIG. 2C) (VT(S1)), the voltage at S2 (see FIG. 2C) (VT(S2)), and the voltage at the end node 206 (VT(Host)) over time. For example, the positive 20V surge test 400 depicts the resulting drop in voltage on each of the switch circuits 202 shown in FIG. 2C. As shown in FIG. 4, the switch device provides good protection for a positive 20V surge. Also, the positive 20V surge test 400 depicts the current at the common node 204 over time, where the current flow is relatively low during a surge.

Figure 5:
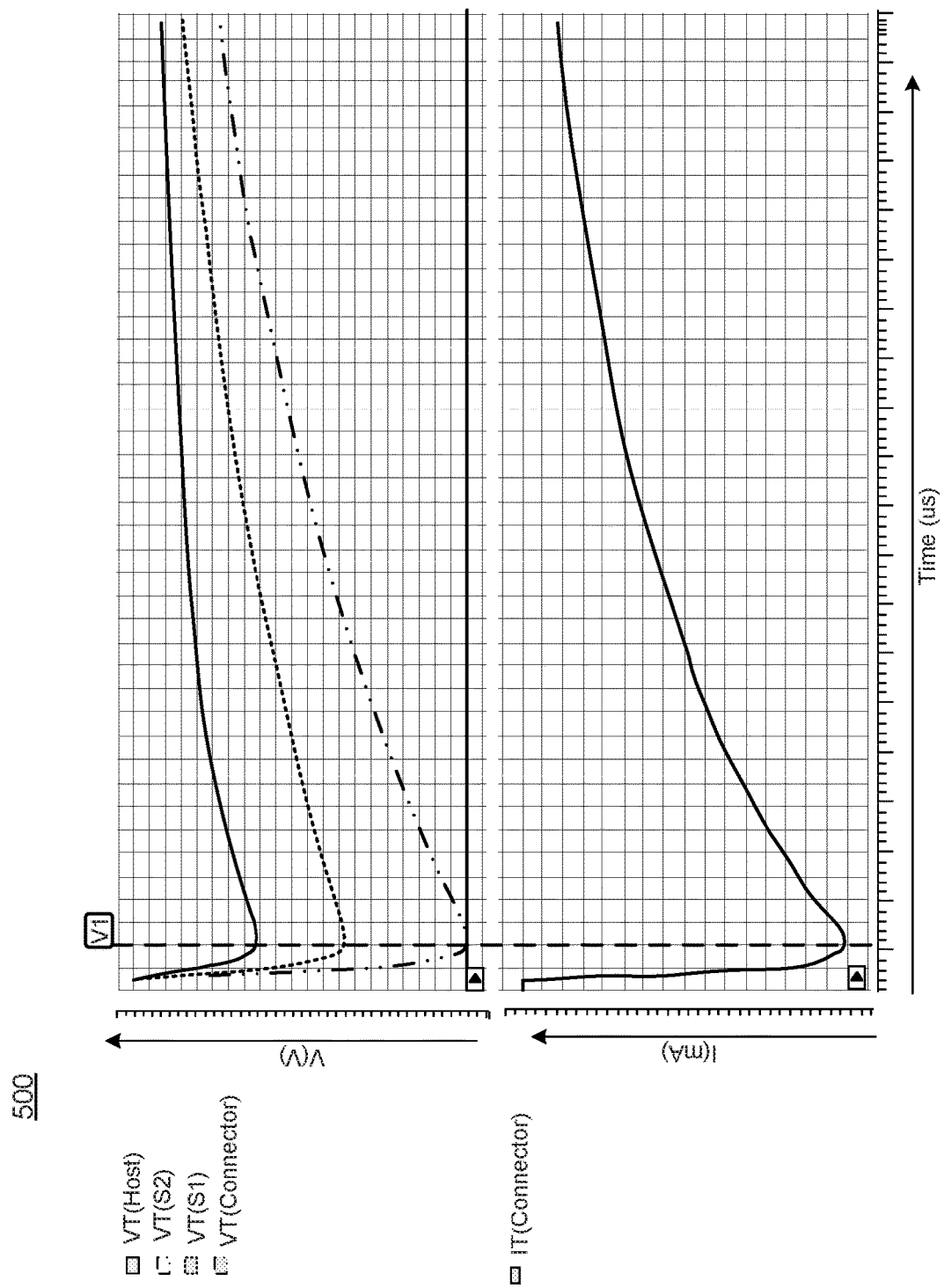
FIG. 5 illustrates a graph depicting results of a negative surge test according to an aspect.

FIG. 5 illustrates a negative 20V surge test 500 for a switch device according to an aspect. For example, when a negative 20V is applied at the common node 204, the negative 20V surge test 500 depicts the voltage at the common node 204 (VT(Connector)), the voltage at S1 (see FIG. 2C) (VT(S1)), the voltage at S2 (see FIG. 2C) (VT(S2)), and the voltage at the end node 206 (VT(Host)) over time. The negative 20V surge test 500 depicts the resulting drop in voltage on each of the switch circuits 202 shown in FIG. 2C. As shown in FIG. 5, the switch device provides good protection for a negative 20V surge. Also, the negative 20V surge test 400 depicts the current at the common node 204 over time, where the current flow is relatively low during a surge.

Figure 6:
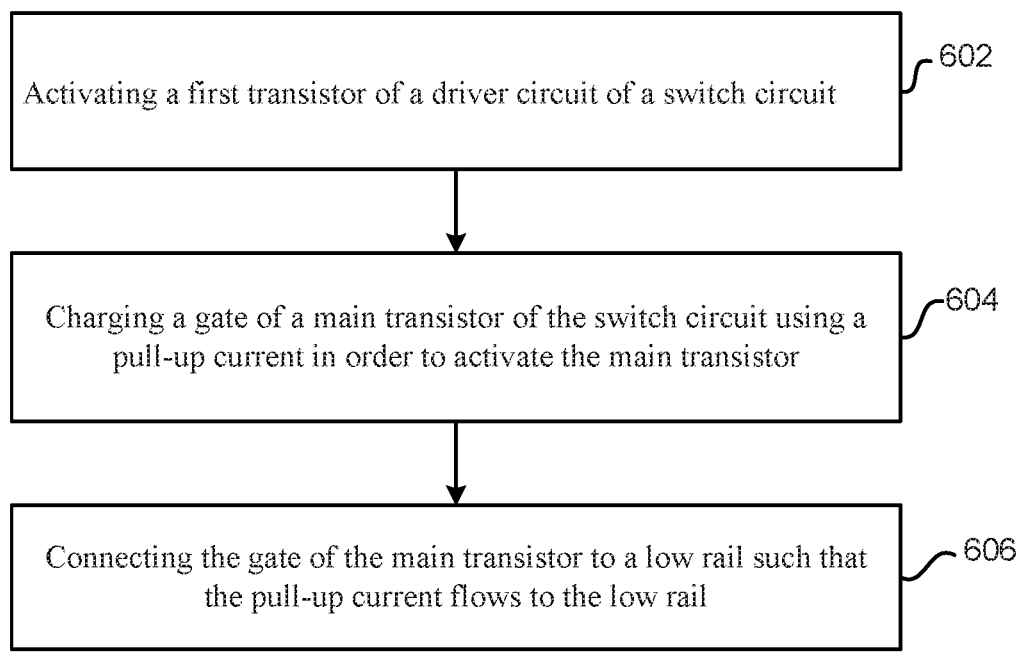
FIG. 6 illustrates a flow chart depicting example operations of a switch circuit according to an aspect.

FIG. 6 illustrates a flowchart 600 depicting example operations of a switch circuit according to an aspect.

Although the flowchart 600 of FIG. 6 illustrates operations in sequential order, it will be appreciated that this is merely an example, and that additional or alternative operations may be included. Further, operations of FIG. 6 and related operations may be executed in a different order than that shown, or in a parallel or overlapping fashion. The operations of FIG. 6 may be performed by any of the switch circuits discussed herein.

Operation 602 includes activating a first transistor of a driver circuit of a switch circuit. For example, the transistor 244 of the driver circuit 242 may be activated. Operation 604 includes charging a gate of a main transistor of the switch circuit using a pull-up current in order to activate the main transistor. For example, the gate of the main transistor 210 may be charged using the pull-up current Ipu in order to activate the main transistor 210. Operation 606 includes connecting the gate of the main transistor to a low rail such that the pull-up current flows to the low rail. For example, the gate of the main transistor 210 may be connected to the low rail 243 so that the pull-up current may flow to the low rail 243. For example, the transistor 254 is activated, and the gate of the main transistor 210 is connected to the low rail 243 via the diode 252 and the resistor 260. The pull-up current Ipu may flow from the voltage source, through the resistor 248, the diode 252, the transistor 254, the resistor 260, and to the low rail 243. In some examples, the operations include activating the transistor 246 of the driver circuit 242 and deactivating the transistor 244 in response to an overvoltage signal by the overvoltage protection circuit 268, and clamping the voltage on the high local rail 225 by the clamp circuit 236.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A switch circuit for a Universal Serial Bus (USB) connector device, the switch circuit comprising:
    a main transistor configured to be activated during a normal operation of the switch circuit, the main transistor configured to be deactivated during an overvoltage event;
    a first voltage generator circuit configured to generate a voltage on a high local rail during the overvoltage event;
    a second voltage generator circuit configured to generate a voltage on a low local rail during the overvoltage event, the low local rail being connected to a bulk of the main transistor;
    a clamp circuit connected to the first voltage generator circuit and a gate of the main transistor, the clamp circuit configured to clamp the voltage between the high local rail and the gate of the main transistor during the overvoltage event; and
    a moisture detection circuit configured to detect a presence of moisture on a common node coupled to the switch circuit.

2. The switch circuit of claim 1, wherein the clamp circuit includes a first diode and a second diode, the first diode being connected to the first voltage generator circuit, the second diode being connected to the gate of the main transistor.

3. The switch circuit of claim 1, wherein the first voltage generator circuit is configured to provide either a drain voltage of the main transistor or a source voltage of the main transistor as the voltage on the high local rail, whichever is larger.

4. The switch circuit of claim 1, wherein the second voltage generator circuit is configured to provide either a drain voltage of the main transistor or a source voltage of the main transistor as the voltage on the low local rail, whichever is smaller.

5. The switch circuit of claim 1, further comprising:
    a first bias circuit configured to generate a voltage on the high local rail during the normal operation, the first bias circuit including a first pair of transistors with gates connected to each other, the gates of the first pair of transistors being connected to the gate of the main transistor; and
    a second bias circuit configured to generate a voltage on the low local rail during the normal operation, the second bias circuit including a second pair of transistor with gates connected to each other, the gates of the second pair of transistors being connected to the gate of the main transistor.

6. The switch circuit of claim 5, wherein the first bias circuit is configured to generate the voltage on the high local rail as one half times a sum of a drain voltage of the main transistor and a source voltage of the main transistor, and the second bias circuit is configured to generate the voltage on the low local rail as one half times a sum of the drain voltage and the source voltage.

7. The switch circuit of claim 1, further comprising:
a constant gate-source circuit connected to the main transistor, the constant gate-source circuit configured to generate a substantially constant gate-source voltage for the main transistor during the normal operation, the constant gate-source circuit connected to the gate of the main transistor and a low rail.

8. The switch circuit of claim 7, wherein the constant gate-source circuit includes a first diode and a transistor, the first diode being connected to the gate of the main transistor, the transistor being connected to the first diode.

9. The switch circuit of claim 8, wherein the constant gate-source circuit includes a second diode and a resistor, the second diode being connected to a drain of the transistor, the second diode being connected to a gate of the transistor, the second diode and the resistor configured to protect the transistor during the overvoltage event.

10. The switch circuit of claim 1, further comprising:
a driver circuit configured to deactivate the main transistor in response to a voltage on the common node exceeding a threshold level, the driver circuit including a pair of transistor with drains coupled to each other.

11. A switch device comprising:
a first switch circuit; and
a second switch circuit connected in-series to the first switch circuit, the first switch circuit and the second switch circuit defining a switch path from a common node to an end node, the first switch circuit including:
a main transistor configured to be activated during a normal operation of the switch device, the main transistor configured to be deactivated during an overvoltage event;
a constant gate-source circuit connected to the main transistor, the constant gate-source circuit configured to generate a substantially constant gate-source voltage for the main transistor during the normal operation, the constant gate-source circuit connected to the gate of the main transistor and a low rail;
a first voltage generator circuit configured to generate a voltage on a high local rail during the overvoltage event;
a second voltage generator circuit configured to generate a voltage on a low local rail during the overvoltage event; and
a moisture detection circuit configured to detect a presence of moisture on the common node.

12. The switch device of claim 11, wherein the first switch circuit further includes:
a clamp circuit connected to clamp the voltage between the high local rail and the gate of the main transistor during the overvoltage event, the high local rail being connected to the gate of the main transistor through the clamp circuit, the clamp circuit configured to protect the main transistor from incurring a Safe Operating Range (SOA) warning during the overvoltage event.

13. The switch device of claim 12, wherein the clamp circuit includes a diode and a Zener diode, the Zener diode being connected to the first voltage generator circuit, the diode being connected to the gate of the main transistor.

14. The switch device of claim 11,
wherein the voltage generator circuit is configured to protect the main transistor from incurring a Safe Operating Range (SOA) warning during the overvoltage event.

15. The switch device of claim 11,
wherein the low local rail is connected to a bulk of the main transistor, the voltage generator circuit configured to protect the main transistor from incurring a Safe Operating Range (SOA) warning during the overvoltage event.

16. The switch device of claim 11, further comprising:
a driver circuit configured to deactivate the main transistor in response to a voltage on the common node exceeding a threshold level, the driver circuit including a first transistor and a second transistor,
wherein the constant gate-source circuit includes a first diode connected to the gate of the main transistor, a transistor having a gate connected to a bulk of the main transistor, a second diode, and a resistor connected to the second diode, the resistor being connected to a source of the second transistor.

17. The switch device of claim 11, further comprising:
an overvoltage protection circuit configured to detect the overvoltage event by determining that a voltage on the common node exceeds a threshold level.

18. The switch device of claim 11, wherein the first switch circuit includes:
a first bias circuit configured to generate a voltage on the high local rail during the normal operation, the high local rail being connected to the gate of the main transistor; and
a second bias circuit configured to generate a voltage on the low local rail during the normal operation, the low local rail being connected to a bulk of the main transistor.

19. A method for reducing leakage current in a switch device, comprising:
activating a first transistor of a driver circuit of a switch circuit;
charging a gate of a main transistor of the switch circuit using a pull-up current in order to activate the main transistor;
connecting the gate of the main transistor to a low rail such that the pull-up current is directed to the low rail;
activating a second transistor of the driver circuit in response to an overvoltage signal;
generating a voltage on a high local rail in response to the overvoltage signal;
generating a voltage on a low local rail in response to the overvoltage signal; and
detecting a presence of moisture on a common node connected to the switch circuit.

20. The method of claim 19, further comprising:
deactivating the first transistor in response to the overvoltage signal;
clamping the voltage on the high local rail, the high local rail being connected to the gate of the main transistor.

* * * * *